(12) United States Patent
Chen et al.

(10) Patent No.: US 11,637,064 B2
(45) Date of Patent: *Apr. 25, 2023

(54) ADVANCED METAL CONNECTION WITH METAL CUT

(71) Applicant: Taiwan Semiconductor Manufacturing Company Limited, Hsinchu (TW)

(72) Inventors: Chih-Liang Chen, Hsinchu (TW); Cheng-Chi Chuang, New Taipei (TW); Chih-Ming Lai, Hsinchu (TW); Chia-Tien Wu, Taichung (TW); Charles Chew-Yuen Young, Cupertino, CA (US); Hui-Ting Yang, Hsinchu (TW); Jiann-Tyng Tzeng, Hsinchu (TW); Kam-Tou Sio, Hsinchu County (TW); Ru-Gun Liu, Hsinchu County (TW); Shun Li Chen, Tainan (TW); Shih-Wei Peng, Hsinchu (TW); Tien-Lu Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 143 days.

This patent is subject to a terminal disclaimer.

(21) Appl. No.: 17/098,717

(22) Filed: Nov. 16, 2020

(65) Prior Publication Data

US 2021/0066182 A1   Mar. 4, 2021

Related U.S. Application Data

(63) Continuation of application No. 16/581,833, filed on Sep. 25, 2019, now Pat. No. 10,847,460, which is a
(Continued)

(51) Int. Cl.
*H01L 23/528* (2006.01)
*H01L 21/768* (2006.01)
(Continued)

(52) U.S. Cl.
CPC ...... *H01L 23/528* (2013.01); *H01L 21/76883* (2013.01); *H01L 21/76892* (2013.01);
(Continued)

(58) Field of Classification Search
CPC ............ H01L 23/528; H01L 21/76883; H01L 21/76892; H01L 23/5226; H01L 27/0207; H01L 29/4916
See application file for complete search history.

(56) References Cited

U.S. PATENT DOCUMENTS 5,354,695 A    10/1994  Leddy
2002/0119640 A1*  8/2002  Gonzalez ............ H01L 25/0657
                                                         257/E21.507
(Continued)

FOREIGN PATENT DOCUMENTS

CN    104252555    12/2014
CN    104656376     5/2015
(Continued)

OTHER PUBLICATIONS

Taiwan office action; Application No. 106112964; dated Sep. 4, 2020.
(Continued)

*Primary Examiner* — Jay C Chang
*Assistant Examiner* — Mikka Liu
(74) *Attorney, Agent, or Firm* — Jones Day (57) ABSTRACT

Examples of an integrated circuit a having an advanced two-dimensional (2D) metal connection with metal cut and methods of fabricating the same are provided. An example method for fabricating a conductive interconnection layer of
(Continued)

an integrated circuit may include: patterning a conductive connector portion on the conductive interconnection layer of the integrated circuit using extreme ultraviolet (EUV) lithography, wherein the conductive connector portion is patterned to extend across multiple semiconductor structures in a different layer of the integrated circuit; and cutting the conductive connector portion into a plurality of conductive connector sections, wherein the conductive connector portion is cut by removing conductive material from the metal connector portion at one or more locations between the semiconductor structures.

20 Claims, 4 Drawing Sheets

Related U.S. Application Data continuation of application No. 16/165,062, filed on Oct. 19, 2018, now Pat. No. 10,468,349, which is a continuation of application No. 15/455,623, filed on Mar. 10, 2017, now Pat. No. 10,109,582.

(60) Provisional application No. 62/324,392, filed on Apr. 19, 2016.

(51) Int. Cl.
| | |
|---|---|
| *H01L 23/522* | (2006.01) |
| *H01L 27/02* | (2006.01) |
| *H01L 29/49* | (2006.01) |

(52) U.S. Cl.
CPC ...... *H01L 23/5226* (2013.01); *H01L 27/0207* (2013.01); *H01L 29/4916* (2013.01)

(56) References Cited

U.S. PATENT DOCUMENTS

| | | | |
|---|---|---|---|
| 2005/0106882 A1 | 5/2005 | Chao et al. | |
| 2010/0025858 A1 | 2/2010 | Weiss et al. | |
| 2012/0235066 A1* | 9/2012 | Ershov | H01S 3/2316 |
| | | | 315/111.21 |
| 2015/0001734 A1 | 1/2015 | Liu et al. | |
| 2015/0243515 A1 | 8/2015 | Yuan et al. | |
| 2017/0018543 A1* | 1/2017 | Elsayed | H01L 29/16 |

FOREIGN PATENT DOCUMENTS

| | | |
|---|---|---|
| CN | 104979278 | 10/2015 |
| CN | 105122141 | 12/2015 |
| TW | 200843076 | 11/2008 |
| WO | 2015199682 | 12/2015 |

OTHER PUBLICATIONS

Chinese Office action, Application No. 201710256641.7; dated Mar. 29, 2021.

* cited by examiner

ADVANCED METAL CONNECTION WITH METAL CUT

CROSS-REFERENCE TO RELATED APPLICATIONS

This application is a continuation application of U.S. patent application Ser. No. 16/581,833, filed Sep. 25, 2019, entitled "Advanced Metal Connection With Metal Cut," which is a continuation application of U.S. patent application Ser. No. 16/165,062, filed Oct. 19, 2018, entitled "Advanced Metal Connection with Metal Cut," which is a continuation application of U.S. application Ser. No. 15/455,623, filed Mar. 10, 2017, entitled "Advanced Metal Connection with Metal Cut," which claims priority to U.S. Provisional Application No. 62/324,392, filed Apr. 19, 2016, entitled "Advanced-2D Metal Connection with Metal Cut," which are incorporated herein by reference in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component or line that can be created using a fabrication process) has decreased. In the past few decades, the number of transistors per chip area has approximately doubled every two years. In the meantime, the pitch of metal interconnections between IC components (referred to as metal pitch) has also become approximately 30% smaller for matching the smaller sized transistors. Although multiple patterning lithography is theoretically capable of achieving this smaller metal pitch, cost increases and overlay issues between the successive exposures may be obstacles for mass production.

Extreme ultraviolet (EUV) lithography or other advanced lithography techniques may be used to achieve smaller metal pitch. Compared to other light sources commonly used for photolithography, EUV employs a shorter wavelength which can provide higher resolution and better critical dimension uniformity (CDU). EUV lithography may, for example, be used for patterning very small semiconductor technology nodes, such as 14-nm, and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. EUV lithography may be cost effective by reducing the photomask usage from multiple patterning to single or double patterning.

EUV lithography may, for example, be used to pattern one dimensional (1D) and two dimensional (2D) metal connections. A one-dimensional metal connection process provides two metal layers for X-Y routing. That is, one layer includes parallel metal lines extending in a first direction (e.g., vertical lines), and another layer includes parallel metal lines extending in a second perpendicular direction (e.g., horizontal lines). The desired metal interconnections are then provided by adding inter-layer connections (e.g., metalized vias) at certain intersections of the perpendicular metal lines. The resulting metal connections are one-dimensional in the sense that each of the metal layers is patterned in only a single direction (e.g., horizontally or vertically). One-dimensional metal connections may be advantageous for certain applications because the process utilizes a simple pattern and provides a small cell area. However, the need for two metal layers may be undesirable in some applications.

A two-dimensional metal connection process provides X-Y routing on a single metal layer. That is, two-dimensional metal shapes are patterned on a single semiconductor layer using EUV or other advanced lithography photolithography techniques to provide the desired metal connections, for example using a double or triple patterning process. The use of two-dimensional metal shapes enables inter-layer connections (e.g., metalized vias) to be more easily placed at any desired location compared to a one-dimensional connection process. However, although this two-dimensional EUV metal connection process advantageously provides metal interconnections on a single semiconductor layer, each of the two-dimensional metal shapes needs to be patterned separately. As a result, there may be limitations on the achievable connector density, along with other potential disadvantages such as a large cell area and a large amount of required mask space.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to semiconductor fabrication and more particularly to an integrated circuit that includes a conductive (e.g., metal) interconnection layer that is fabricated using extreme ultraviolet (EUV) lithography and a conductive interconnection (e.g., metal) cut.

EUV lithography may be used to achieve smaller metal pitch. For example, a pair of masks are used to construct a pair of metal portions. A metal pitch is the distance between centers of the metal portions. Compared to other light sources commonly used for photolithography, EUV employs a shorter wavelength which can provide higher resolution and better critical dimension uniformity (CDU). EUV lithography may, for example, be used for patterning very small semiconductor technology nodes, such as 14-nm, and beyond. EUV lithography is very similar to optical lithography in that it needs a mask to print wafers, except that it employs light in the EUV region, e.g., at about 13.5 nm. EUV lithography may thus be cost effective by reducing the photomask usage from multiple patterning to single or double patterning.

Figure 1:
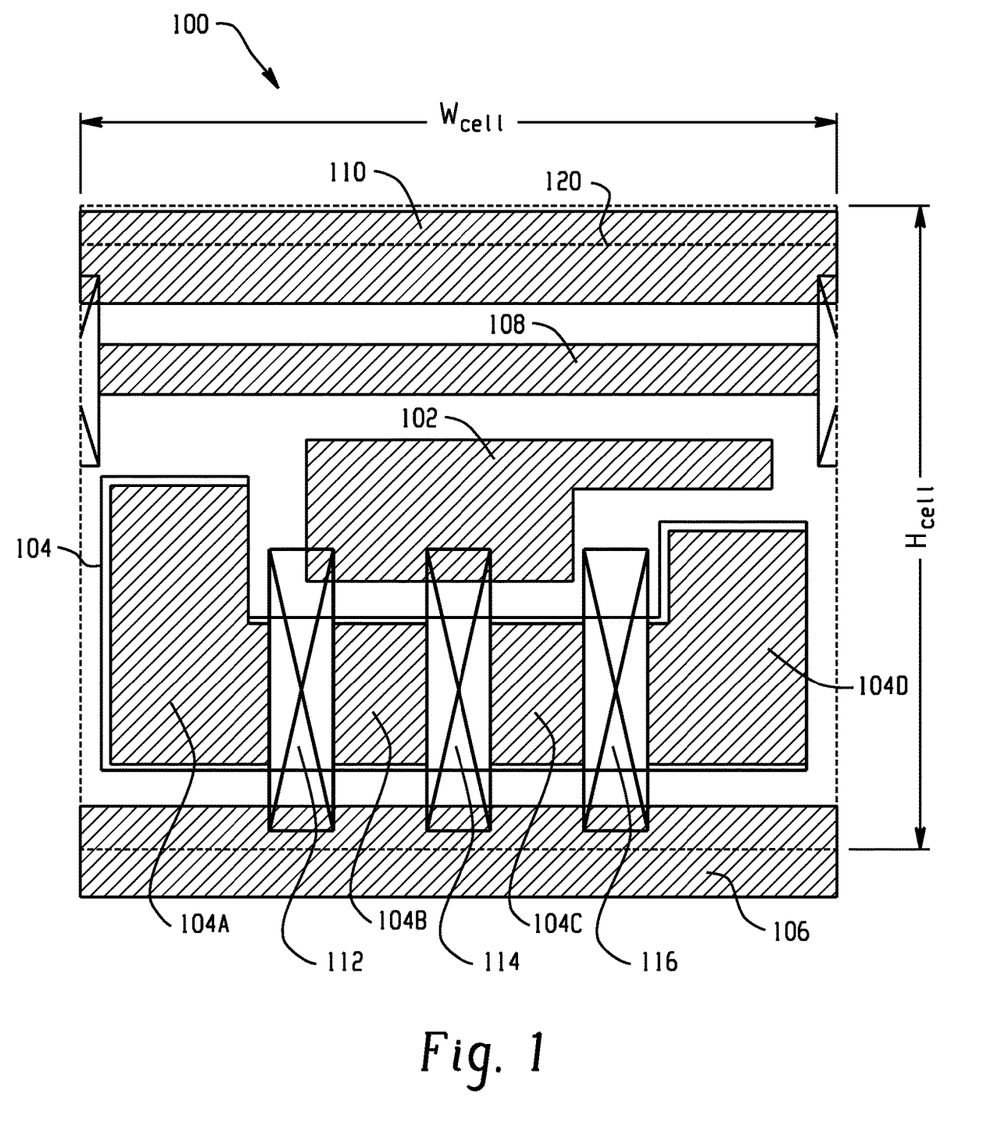
FIG. 1 illustrates an example of a conductive (e.g., metal) interconnection layer for an integrated circuit that is fabricated using EUV lithography and a metal cut.

FIG. 1 illustrates an example of a conductive (e.g., metal) interconnection layer 100 for an integrated circuit that is fabricated using EUV lithography and a conductive interconnection (e.g., metal) cut. The integrated circuit includes a cell 120 enclosed by a boundary (indicated by dash lines) and has a height (Hcell) and a width (Wcell). The cell 120 is configured to perform a cell function. For example, the cell 120 is an inverter that inverts a signal from low to high and vice versa. In some embodiments, the cell 120 includes an AND gate, a NAND gate, an OR gate, a NOR gate, an XOR gate, an XNOR gate, another logic gate, or a combination thereof. The example metal interconnection layer 100 includes multiple metal portions 102, 104, 106, 108, 110 that are patterned on a semiconductor, e.g., photoresist or substrate, layer above the cell 120 using EUV lithography or other advanced lithography techniques. In some embodiments, the EUV lithography process employs an EUV radiation source having a wavelength of about 1-100 nm, including an EUV wavelength of about 13.4 nm. One example EUV lithography process is described in commonly owned U.S. Pat. No. 9,354,507, titled "Extreme Ultraviolet Lithography Process and Mask," which is incorporated herein by reference.

As illustrated, EUV lithography may be utilized to pattern both rectangular (106, 108, 110) and non-rectangular (102, 104) metal shapes on the same substrate layer. In addition, the example metal interconnection layer 100 includes metal connector sections that are formed by cutting one or more of the larger patterned metal portions into sections that are spaced apart by the width of the metal cut. Specifically, in the illustrated example, a non-rectangular metal portion 104 (shown enclosed within the solid line) is patterned using EUV lithography, and is then cut into four metal connector sections 104A, 104B, 104C, 104D. In this way, the four metal connector sections 104A, 104B, 104C, 104D may be formed with the same mask.

The example conductive interconnection layer 100 illustrated in FIG. 1 includes conductive features, referred to herein as "metal" connections, portions or shapes. It should be understood, however, that conductive features may include pure metals such as copper, tungsten, tin, aluminum, silver, and gold, metal alloys and compounds such as TiN, WN, WNC, TaN, and TaSiN, conductive carbon compounds, polymer conductors, organic conductors, and any other conductive material.

Cuts in the metal interconnections are illustrated in FIG. 1 and throughout the drawings by a rectangle with an "X" through the middle. In the illustrated example, three metal cuts 112, 114, 116 are illustrated through patterned metal portion 104. It should be understood that these metal cuts 112, 114, 116 represent areas of the semiconductor layer in which the patterned metal has been removed, for example leaving only substrate material. The metal cutting may be performed using various techniques, for example as set forth in commonly owned U.S. Pat. No. 8,850,360, titled "Metal Cut Process Flow," which is incorporated herein by reference.

Although a pattern of the metal interconnection sections 104A-104D may be transferred to a photoresist layer, e.g., using a single mask, such a pattern may be transferred with sufficient resolution only when the metal interconnection sections 104A-104D are of a minimum pitch. Less than the minimum pitch, a photoresist pattern may begin to blur. By patterning metal connections using EUV lithography and cutting one or more of the patterned metal connections into smaller connector sections, the process described herein may, for example, be used to provide larger metal interconnection sections that are of a pitch less than the minimum and that are thus more densely spaced. In addition, compared to other techniques in which metal interconnection sections are separately patterned (e.g., using separate masks), the larger metal sections 104A-104D provided in the example of FIG. 1 provide for more flexible via placement and better metal-via enclosure, as illustrated in FIGS. 2A and 2B.

Figure 2A:
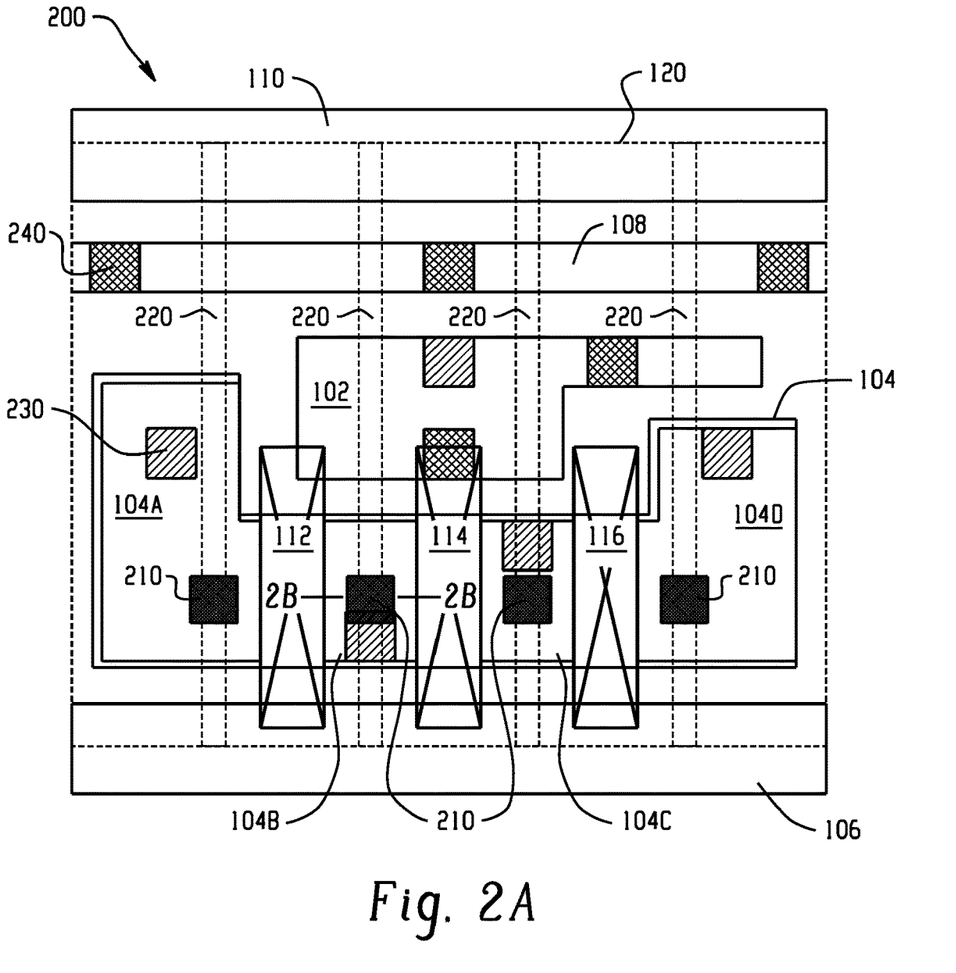
FIG. 2A depicts the conductive interconnection layer of FIG. 1 with example inter-layer connections that electrically connect the metal interconnection layer to other semiconductor layers.
Figure 2B:
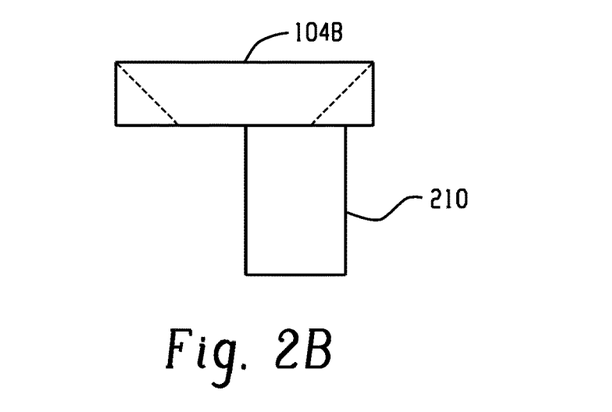
FIG. 2B illustrates a sectional view taken along line 2B-2B of FIG. 2A.

FIG. 2A depicts the metal interconnection layer of FIG. 1 with example inter-layer connections (e.g., metalized vias) 210 that electrically connect the metal interconnection layer, e.g., the metal interconnection layer 100, to components, such as gate structures 220 of transistors, of the cell 120. FIG. 2B is a sectional view taken along line 2B-2B of FIG. 2A. As illustrated in FIG. 2A, the example 200 shows how the metal connector sections 104A-104D formed by cutting the larger patterned metal portion 104 may be sized and spaced to provide a suitable metal enclosure for vias 210 connecting to tightly pitched structures 220 on an adjacent semiconductor layer. For example, as illustrated in FIG. 2B, the metal connector section 104B has a substantially rectangular, i.e., not tapered (as indicated by dash lines), cross section. It is noted that when the cross section of the metal connector section 104B is tapered, as illustrated in FIG. 2B, the via 210 may partially land on the metal connector section 104B and thus have a poor electrical contact therewith. In contrast, because the cross section of the metal connector section 104B is rectangular, the via 210 can entirely land within the metal connector section 104B, be positioned closed to an edge/side of the metal connector section 104B and thus have a good electrical contact therewith. The same is true with the metal connection sections 104A, 104C, 104D and the vias 210 connected therewith, whereby the metal connector sections 104A-104D provide a suitable metal enclosure for the vias 210.

The gate structures 220 may, for example, be patterned polysilicon lines that form gate stacks for a semiconductor device. Specifically, in the illustrated example, EUV lithography is used to pattern an initial metal portion 104 that extends across multiple polysilicon lines 220 in the adjacent layer, and the metal portion 104 is then cut into multiple metal connector sections 104A-104D by removing metal at locations between the polysilicon lines. As shown, because the vias 210 entirely land within and are positioned closed to an edge/side of the metal connector sections 104A-104D, respectively, the metal cuts 112, 114, 116 have a sufficiently small width to leave good metal coverage around the gate vias 210 (which are added subsequently.)

Also illustrated in FIG. 2A are examples of other inter-layer connections to the metal interconnection layer 100, including contact via connections 230 to one or more semiconductor structures or connections above the metal interconnection layer 100 and contact via connections 240 to one or more semiconductor structures or connections below the metal interconnection layer 100.

Figure 3A:
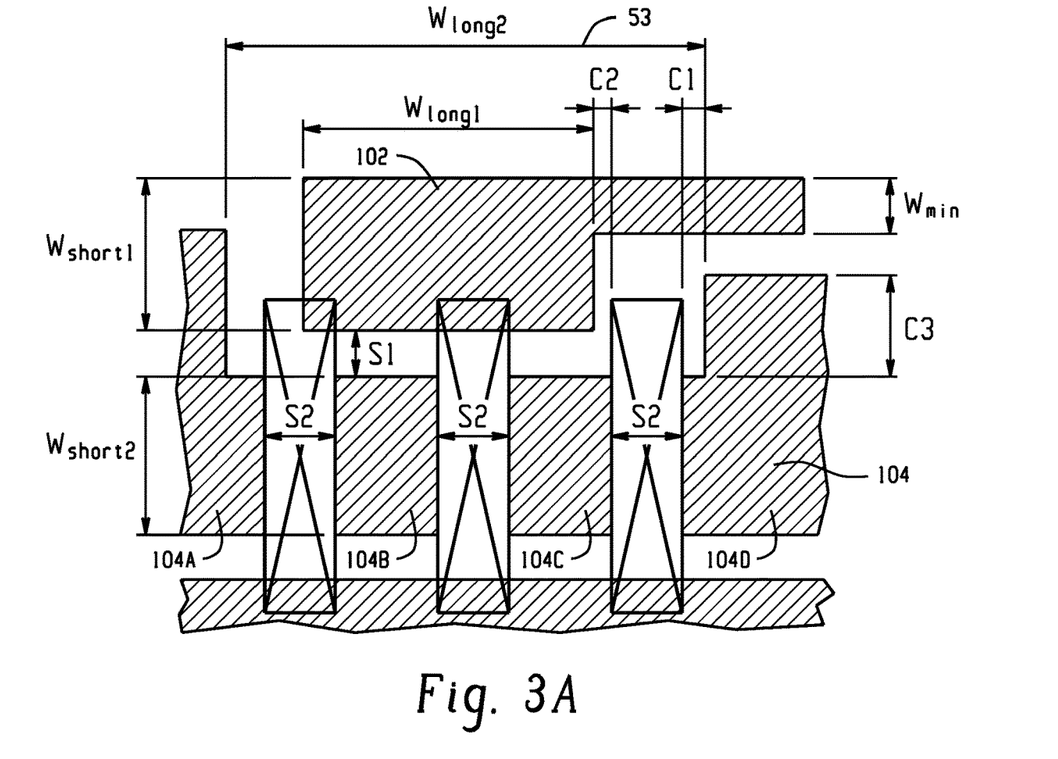
FIGS. 3A, 3B, and 4 illustrate example spacing rules and constraints that may be utilized in a conductive (e.g., metal) interconnection layer for an integrated circuit that is fabricated using EUV lithography and a metal cut.
Figure 3B:
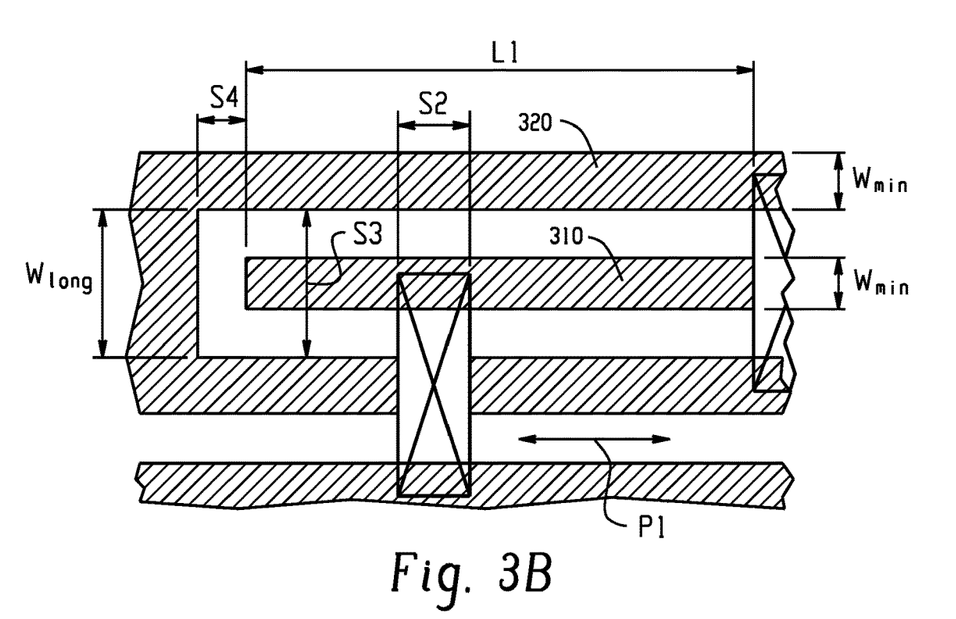

FIGS. 3A and 3B illustrate example metal spacing rules that may be applied to optimize spacing in a metal interconnection layer that is fabricated using the techniques described herein with respect to FIGS. 1 and 2A. With reference first to FIG. 3A, a metal portion, e.g., metal portions 102, 104A-104D, of a metal interconnection layer, e.g., metal interconnection layer 100, has a width. The minimum width (Wmin) among the widths of metal portions, e.g., metal portions 102, 104A-104D, of the metal interconnection layer is defined by a pitch (P1) of gate structures, e.g., gate structures 220, of the metal interconnection layer. The pitch (P1) is, for example, the distance between centers of the gate structures. The metal portion may further have a short side/edge (Wshort) and a long side/edge (Wlong). The short side (Wshort) is greater than the minimum width (Wmin), but is less than the long side (Wlong). A spacing (S1) between long sides, e.g., long sides (Wlong1, Wlong2), is defined by the pitch (P1). A spacing (S2) between short sides of an adjacent pair of metal portions, e.g., short side (Wshort2) of metal portion 104B and short side (Wshort2) of metal portion 104C, is defined by the pitch (P1). The spacing (S2) is, for example, a width of a metal cut. A U-shaped metal portion, e.g., metal portion 104, has a pair of first portions and a second portion that interconnects the first portions. A spacing (S3) between first portions of a U-shaped metal connection is defined by the minimum width (Wmin) and the spacing (S1). A metal portion may have a cut edge and an uncut edge. A horizontal distance (C1) between adjacent cut and uncut edges of a metal portion, e.g., metal portion 104D, is defined by the spacing (S1). A horizontal distance (C2) between adjacent cut edge of a metal portion, e.g., metal portion 104C, and uncut edge of another metal portion, e.g., metal portion 102 is defined the spacing (S1). A length (C3) of a first portion of a U-shaped metal connection is defined by the minimum width (Wmin). Using the above parameters, the following metal spacing rules may be applied to the metal interconnection layer:

Range of Wmin: $0.2*P1 \leq Wmin \leq P1$;
Range of short side (Wshort): $Wshort < 2.5*Wmin$;
Range of long side (Wlong): $Wlong \geq 2.5*Wmin$;
Range of long-side (Wlong1) to long-side (Wlong2) spacing (S1): $0.2*P1 \leq S1 \leq 0.6*P1$;
Range of short-side (Wshort1) to short-side (Wshort2) spacing (S2): $0.4*P1 \leq S2 \leq 0.7*P1$;
Range of spacing (S3): $S3 \geq Wmin + 2*S1$; and
Ranges of C1, C2, and C3: $C1 \geq 0.3*S1$, $C2 \geq 0.5*S1$, and $C3 \geq 2*Wmin$.

Although the metal interconnection layer 100 is exemplified in FIG. 3A as having a non-rectangular metal portion 102 that extends into a space defined by the parallel portions of the U-shaped metal connection 104, a metal portion of any shape may extend into such a space. For example, as illustrated in FIG. 3B, a rectangular metal portion 310 extends into a space defined by parallel portions of a U-shaped metal connection 320. With reference to FIG. 3B, a spacing (S4) between the long width (Wlong) and the short width (Wshort), or the minimum width (Wmin), is defined by the spacing (S1). A length (L1) of a rectangular metal portion, e.g., metal portion 310, that has the minimum width, is defined by the pitch (P1) and the spacing (S2). Using the above parameters, the following metal spacing rules may be applied to the metal interconnection layer 100:

Range of spacing (S4): $0.9*S1 \leq S4 \leq 1.2*S1$; and
Range of length (L1): $L1 \geq P1 + S2$.

Figure 4:
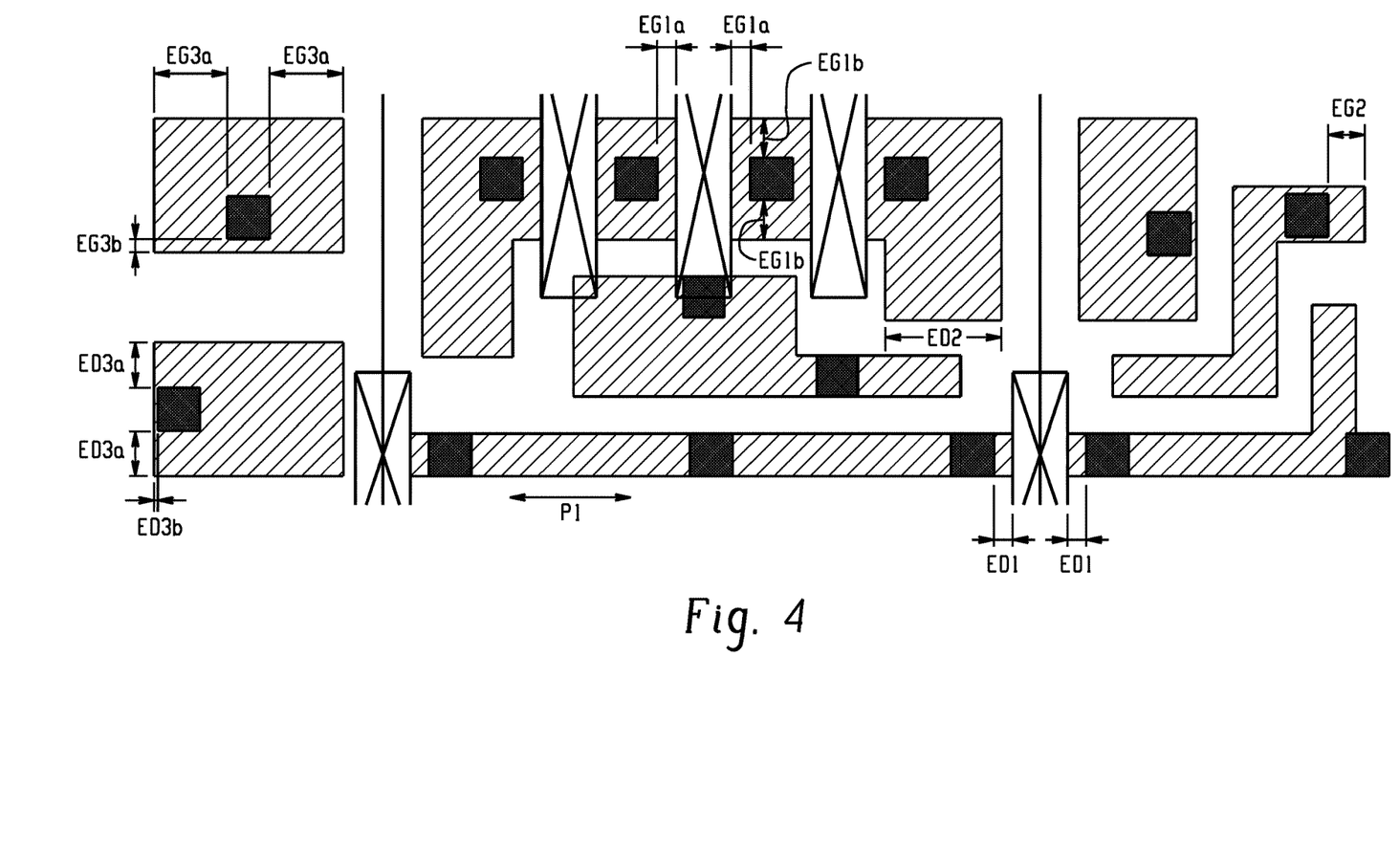

FIG. 4 illustrates example metal spacing rules that may be applied to a metal interconnection layer fabricated using the techniques described herein with reference to FIGS. 1 and 2 in order to provide optimal via enclosure. As illustrated in FIG. 4, the metal interconnection layer 100 further includes metal portions 410, 420, 430 without metal cut. FIG. 4 includes the following spacing parameters: ED1, which is the amount of contact via enclosure, e.g., enclosure of the contact vias 240, from a metal cut (i.e., the space between a metal cut and a contact via), and which is defined by the pitch (P1) and the spacing (S2); ED2, which is the amount of contact via enclosure in a thin connector portion, e.g., the parallel portions of the U-shaped metal connection 104, without a metal cut, and which is defined by the minimum width (Wmin); ED3, which is the amount of contact via enclosure in a wide connector portion, e.g., the metal portion 410, without a metal cut with ED3a being the enclosure from a vertical connector edge and being defined by the pitch (P1) and ED3b being the enclosure from a horizontal connector edge; EG1a, which is the amount of gate via enclosure, e.g., enclosure of the vias 210, from a metal cut, and which is defined by the pitch (P1) and the minimum width (Wmin); EG1b, which is the amount of gate via enclosure from a non-cut connector edge, e.g., edges of the metal connector sections 104A-104D, and which is defined by the minimum width (Wmin); EG2, which is the amount of gate via enclosure in a thin connector portion, e.g., the metal portion 420, without a metal cut, and which is defined by the minimum width (Wmin); and EG3, which is the amount of gate via enclosure in a wide connector portion, e.g., the metal portion 430, without a metal cut with EG3a being the enclosure from a vertical connector edge and being defined by the pitch (P1) and EG3b being the enclosure from a horizontal connector edge. Using the above parameters, the following metal and via spacing rules may be applied to the metal interconnection layer. These metal and via spacing rules can be identified by the transmission electron microscopy (TEM) observable spacing (i.e., pitch) (P) between polysilicon lines on an adjacent semiconductor layer.

Contact Via Enclosure-1: $ED1 \geq 0.5*P1 - S2$;
Contact Via Enclosure-2: $ED2 \geq 1.1*Wmin$;
Contact Via Enclosure-3: $ED3a \geq 0.3*P1$ and $ED3b \geq 0$.
Gate Via Enclosure-1: $EG1a \geq P1 - Wmin$ and $EG1b \geq 1.1*Wmin$;
Gate Via Enclosure-2: $EG2 \geq Wmin$;
Gate Via Enclosure-3: $EG3a \geq 0.3*P1$ and $ED3b \geq 0$.

In one embodiment, a method for fabricating a conductive interconnection layer of an integrated circuit is provided. A conductive connector portion is patterned on the conductive interconnection layer of the integrated circuit using extreme ultraviolet (EUV) lithography, wherein the conductive connector portion is patterned to extend across multiple semiconductor structures in a different layer of the integrated circuit. The conductive connector portion is cut into a plurality of conductive connector sections, wherein the conductive connector portion is cut by removing conductive material from the conductive connector portion at one or more locations between the semiconductor structures.

In another embodiment, an integrated circuit is provided that includes a first integrated circuit layer and a conductive interconnection layer. The first integrated circuit layer includes a plurality of semiconductor structures. The conductive interconnection layer includes a plurality of conductive connector sections, wherein the conductive connector sections are formed by patterning a conductive connector portion on the conductive interconnection layer of the integrated circuit using extreme ultraviolet (EUV) lithography, and cutting the conductive connector portion into the plurality of conductive connector sections by removing conductive material from the conductive connector portion at one or more locations between the semiconductor structures. Via interconnections between the conductive interconnection layer and the first integrated circuit layer electrically connect each of the plurality of conductive connector sections to different ones of the plurality of semiconductor structures.

In another embodiment, a method for fabricating a conductive interconnection layer of an integrated circuit is provided that includes the steps of: patterning a conductive connector portion on the conductive interconnection layer of the integrated circuit using a single photolithography mask; and cutting the conductive connector portion into a plurality of conductive connector sections separated by a cut width, wherein the cut width is based on a predetermined minimum spacing between semiconductor elements on a semiconductor layer of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a conductive interconnection layer of a circuit, comprising:
    patterning a conductive connector portion on the conductive interconnection layer of the circuit;
    cutting the conductive connector portion into a plurality of conductive connector sections, wherein the conductive connector portion is cut by removing a conductive material from the conductive connector portion at at least one locations between a plurality of semiconductor structures; and
    fabricating a via interconnection that electrically connects one of the conductive connector sections to one of the semiconductor structures.

2. The method of claim 1, wherein the conductive connector portion is patterned to extend across the semiconductor structures in a different layer of the circuit.

3. The method of claim 2, wherein the different layer of the circuit is a polysilicon layer, wherein the semiconductor structures include a plurality of polysilicon structures that are separated by a predetermined polysilicon pitch, and wherein the conductive connector portion is patterned to extend across the polysilicon structures in the polysilicon layer.

4. The method of claim 1, further comprising
    fabricating the semiconductor structures comprising patterned polysilicon lines that provide gate structures for a semiconductor device.

5. The method of claim 1, wherein the conductive connector portion is patterned on the conductive interconnection layer of the circuit using extreme ultraviolet (EUV) lithography.

6. The method of claim 5, wherein the EUV lithography employs a radiation source having a wavelength of 13.5 nm.

7. The method of claim 1, wherein the conductive connector portion includes a metal cut between an adjacent pair of the semiconductor structures.

8. A method for fabricating a conductive interconnection layer of an integrated circuit, comprising:
    patterning a conductive connector portion on the conductive interconnection layer of the integrated circuit;
    cutting the conductive connector portion into a plurality of conductive connector sections separated by a cut width based on semiconductor elements disposed at intervals on a semiconductor layer of the integrated circuit; and
    fabricating a via interconnection that electrically connects one of the conductive connector sections to one of the semiconductor elements.

9. The method of claim 8, wherein the semiconductor elements include a plurality of polysilicon structures that are separated by a predetermined polysilicon pitch, and wherein the conductive connector portion is patterned to extend across the plurality of polysilicon structures in the semiconductor layer.

10. The method of claim 8, wherein the conductive connector portion is cut by removing a conductive material from the conductive connector portion at at least one locations between the semiconductor elements, wherein the cut width is further based on a predetermined minimum spacing between the semiconductor elements on the semiconductor layer of the integrated circuit.

11. The method of claim 8, further comprising
    fabricating the semiconductor elements comprising patterned polysilicon lines that provide gate structures for a semiconductor device.

12. The method of claim 8, wherein the semiconductor layer is adjacent to the conductive interconnection layer.

13. The method of claim 8, wherein the conductive connector portion is patterned on the conductive interconnection layer of the integrated circuit using extreme ultraviolet (EUV) lithography.

14. The method of claim 13, wherein the EUV lithography employs a radiation source having a wavelength of 13.5 nm.

15. The method of claim 8, wherein the conductive interconnection layer comprises two-dimensional conductive routing on a single layer.

16. A method comprising:
    patterning a conductive interconnection layer to form a conductive connector portion;
    forming conductive connector sections from the conductive connector portion;
    fabricating a semiconductor device including a plurality of semiconductor structures below the conductive interconnection layer and separated by a predetermined pitch; and
    interconnecting one of the conductive connector sections and one of the semiconductor structures.

17. The method of claim 16, wherein forming the conductive connector sections includes cutting the conductive connector portion.

18. The method of claim 16, wherein the conductive connector portion includes a metal cut between an adjacent pair of the semiconductor structures.

19. The method of claim 16, wherein the conductive connector portion extends across the semiconductor structures.

20. The method of claim 16, wherein forming the conductive connector sections includes patterning the conductive connector portion using extreme ultraviolet (EUV) lithography.

* * * * *